United States Patent
Houston et al.

(10) Patent No.: US 7,499,354 B2
(45) Date of Patent: Mar. 3, 2009

(54) METHOD FOR TESTING TRANSISTORS HAVING AN ACTIVE REGION THAT IS COMMON WITH OTHER TRANSISTORS AND A TESTING CIRCUIT FOR ACCOMPLISHING THE SAME

(75) Inventors: Theodore W. Houston, Richardson, TX (US); Xiaowei Deng, Plano, TX (US); Tito Gelsomini, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/268,974

(22) Filed: Nov. 8, 2005

(65) Prior Publication Data
US 2007/0121390 A1 May 31, 2007

(51) Int. Cl.
*G11C 7/00* (2006.01)

(52) U.S. Cl. .................... 365/201; 365/200; 365/189.08
(58) Field of Classification Search ................. 365/200, 365/201, 63, 189.08
See application file for complete search history.

(56) References Cited

U.S. PATENT DOCUMENTS

| | | | | |
|---|---|---|---|---|
| 4,587,481 A | * | 5/1986 | Lischke et al. | 324/72.5 |
| 4,835,458 A | * | 5/1989 | Kim | 324/73.1 |
| 5,600,578 A | * | 2/1997 | Fang et al. | 703/14 |
| 5,686,335 A | * | 11/1997 | Wuu et al. | 438/154 |
| 5,745,405 A | * | 4/1998 | Chen et al. | 365/154 |
| 6,175,245 B1 | * | 1/2001 | Bowe et al. | 324/765 |
| 6,211,693 B1 | * | 4/2001 | Andresen et al. | 324/769 |
| 6,249,138 B1 | * | 6/2001 | Huang et al. | 324/765 |
| 6,388,927 B1 | * | 5/2002 | Churchill et al. | 365/201 |
| 6,529,421 B1 | * | 3/2003 | Marr et al. | 365/189.09 |
| 6,552,941 B2 | * | 4/2003 | Wong et al. | 365/201 |
| 6,593,590 B1 | * | 7/2003 | Yang et al. | 257/48 |
| 6,774,656 B2 | * | 8/2004 | Baur et al. | 324/765 |
| 6,930,504 B2 | * | 8/2005 | Ishibashi | 324/765 |
| 6,950,359 B2 | * | 9/2005 | Chen et al. | 365/203 |
| 7,149,114 B2 | * | 12/2006 | Taheri et al. | 365/185.08 |
| 7,155,359 B1 | * | 12/2006 | Kim et al. | 702/117 |

* cited by examiner

*Primary Examiner*—Viet Q Nguyen
(74) *Attorney, Agent, or Firm*—Jacqueline J. Garner; W. James Brady, III; Frederick J. Telecky, Jr.

(57) ABSTRACT

The present invention provides a method for testing an electrical property of one or more functionally separate transistors located within an active region that is common with other transistors, a method for characterizing the leakage current of at least one of a plurality of functionally separate transistors located in a common active region of a circuit, and a test structure for testing one or more functionally separate transistors located within a common active region. The method for testing the electrical property, among other steps, includes providing a pair of functionally separate transistors (110) located within a common active region, and biasing a terminal (135) between the pair (110) relative to gates (125, 155) of the pair (110) and terminals (130, 160) outlying the pair (110) to obtain a leakage current associated with the pair (110).

21 Claims, 8 Drawing Sheets

METHOD FOR TESTING TRANSISTORS HAVING AN ACTIVE REGION THAT IS COMMON WITH OTHER TRANSISTORS AND A TESTING CIRCUIT FOR ACCOMPLISHING THE SAME

TECHNICAL FIELD OF THE INVENTION

The present invention is directed, in general, to a method for testing transistors and, more specifically, to a method for testing transistors having an active region that is common with other transistors and a testing circuit for accomplishing the same.

BACKGROUND OF THE INVENTION

Modern electronic equipment, such as televisions, telephones, radios, and computers are generally constructed of solid-state devices. Solid-state devices include transistors, capacitors, resistors, and other semiconductor devices. Typically, such devices are fabricated on a substrate and interconnected to form memory arrays, logic structures, timers, and other components of an integrated circuit. One type of memory array is a static random access memory (SRAM) device, in which memory cells are continuously available for reading and writing data. As technology improves, SRAM cells and other components are fabricated at smaller sizes and with greater on-chip integration.

The increasing level of on-chip integration has allowed steady improvements in modern microprocessor performance, but has also resulted in high energy dissipation in integrated circuits. In complementary metal-oxide-semiconductor (CMOS) circuits, which are often included within SRAMs, transistor threshold voltages have been reduced, along with supply voltages, as the technology is scaled. However, decreasing the transistor threshold voltage typically increases the amount of "static" or "leakage" power dissipated by the CMOS circuit. As transistor threshold voltages continue to be reduced in emerging technologies, leakage power is becoming a sizable percentage of the total power consumed in CMOS circuits.

Knowing that the CMOS circuits may include various disadvantageous characteristics, such as the aforementioned leakage power, the industry generally desires to characterize or quantify the circuit properties before going into large scale production thereof. Such is often the case with SRAM devices. Interestingly, the characteristics of the transistors in the SRAM devices tend to be dependent on the exact environment they will ultimately be included within. For example, a transistor having a given width and length would not exhibit the same characteristics if it were isolated by itself as compared to if it were located within a high density array. Correspondingly, the industry desires to characterize the transistors of the SRAM devices in an environment similar to the high-density array environment it will ultimately be included within.

Accordingly, what is needed in the art is a method for accurately characterizing the transistors of a transistor array while the transistors are in their standard environment, and a testing circuit for accomplishing the same.

SUMMARY OF THE INVENTION

To address the above-discussed deficiencies of the prior art, the present invention provides a method for testing an electrical property of one or more functionally separate transistors located within an active region that is common with other transistors, a method for characterizing the leakage current of at least one of a plurality of functionally separate transistors located in a common active region of a circuit, and a test structure for testing one or more functionally separate transistors located within a common active region. The method for testing the electrical property, among other steps, includes providing a pair of functionally separate transistors located within an active region, and biasing a terminal between the pair relative to gates of the pair and terminals outlying the pair to obtain a leakage current associated with the pair. In one embodiment, the functionally separate transistors are configured in the same topology as in a circuit application, such as in an SRAM array.

As indicated above, the present invention further provides a method for characterizing the leakage current of at least one of a plurality of functionally separate transistors located in a common active region of a circuit. One embodiment of this inventive method includes providing a test structure comprising a replication of a plurality of functionally separate transistors located in a common active region of a circuit, the test structure thereby including a plurality of test transistors located in a common active test region, and biasing at least one pair of test transistors within the plurality of test transistors such that a leakage current of the at least one pair can be measured without contamination of spurious gate-edge-diode-leakage (GEDL) from remaining ones of the plurality of test transistors, the measured leakage current helping to characterize a leakage current of the plurality of transistors located in the common active region of the circuit.

As briefly mentioned above, the present invention additionally provides a test structure for testing one or more functionally separate transistors located within a common active region. The test structure, without limitation, includes a pair of functionally separate transistors located within a common active region. The test structure further includes a first interconnect configured to contact a terminal between the pair, a second interconnect configured to directly couple and contact gates of the pair, and a third interconnect configured to directly couple and contact terminals outlying the pair, the first, second and third interconnects configured to allow the terminal to be biased relative to the gates and outlying terminals, where the bias may be non-zero, to obtain a leakage current associated with the pair.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the recognition that testing the electrical characteristics of a single functionally separate transistor located within a high density array of a circuit is often problematic. The present invention has uniquely recognized that neighboring transistors, even if turned off, tend to provide parasitic electrical characteristic values that distort the true electrical characteristic values of the functionally separate transistor being tested. These issues have been particularly observed in high-density arrays, such as those found in static random access memory (SRAM) devices.

The present invention has further recognized that the parasitic electrical characteristic values are particularly problematic when testing the leakage current of a single functionally separate transistor. Without being limited to any particular theory, the present invention theorizes that gate edge diode leakage (GEDL) from neighboring transistors (e.g., those transistors sharing a terminal, or drain in most instances, with the single functionally separate transistor being tested, as well as being located in the same active region) may be attributed with a significant portion of the parasitic leakage current.

Given the foregoing recognitions, the present invention acknowledged that the parasitic leakage current could be reduced, if not eliminated, by characterizing pairs of functionally separate transistors in a particular fashion. If the pair of functionally separate transistors are like transistors, the measured leakage current can be attributed equally to the two functionally separate transistors for determining the average leakage current for such transistors. If the pair of transistors are not like transistors, the leakage per transistor will be less precisely known. Nevertheless, the leakage per pair of transistors is still useful information for understanding the total leakage in a circuit.

Like transistors, as used herein, are transistors that have substantially identical properties, including without limitation, dopant types, dopant concentrations, material types, gate lengths, gate widths, work function, and other related properties. For example, in one situation wherein the transistors being tested form at least a portion of a SRAM device, the pair of like transistors could be a pair of like drive transistors, or in another example a pair of like pass transistors. Each of the pair of like transistors, whether they be like drive transistors or like pass transistors, are advantageously located in adjacent cells of the SRAM device. As adjacent cells of the SRAM device are typically mirror images of one another, the pair of like transistors are generally located proximate one another. It should be noted that other different types of like transistors could also be used.

Functionally separate, as used herein, means that at least one of the source, gate, drain or substrate of a transistor, when in an actual circuit that will be sold to a consumer, is connected to a different circuit node. Accordingly, functionally separate transistors do not include a multi-finger transistor structure operated in parallel to increase the drive current. However, functionally separate transistors might include a drive transistor located within a SRAM array, a pass gate transistor located within a SRAM array, a transistor in a NAND gate, a transistor in a multiplier array, etc. .

In an exemplary embodiment of the present invention, the pairs of functionally separate transistors are characterized by biasing a terminal between the pair of functionally separate transistors relative to gates of the pair and terminals outlying the pair. In this exemplary embodiment, the terminal between the pair is biased with respect to the substrate, where the bias may be non-zero, thus leakage is induced. However, the terminals outlying the pair are at the same bias with respect to the substrate, and thus little or no leakage is induced. Accordingly, the terminals outlying the pair act as an isolation region for the pair, and thereby reduce or eliminate the parasitic leakage current from adjacent transistors on opposing sides of the pair.

Using the aforementioned process, the actual leakage current associated with the pair may be measured. Thereafter, the actual measured leakage current of the pair may be divided by two to account for the two functionally separate transistors in the pair, thus obtaining an accurate measurement of the actual leakage current for each of the transistors. Because the pair of functionally separate transistors are like transistors, as defined above, the division of the actual measured leakage current of the pair is appropriate. For pairs of unlike functionally separate transistors, the above method, excluding the division by two, gives an accurate measurement of the total leakage of the pair. An accurate measure of the sum of leakage of two transistors is useful even without an allocation of the leakage to individual transistors.

Figure 1A:
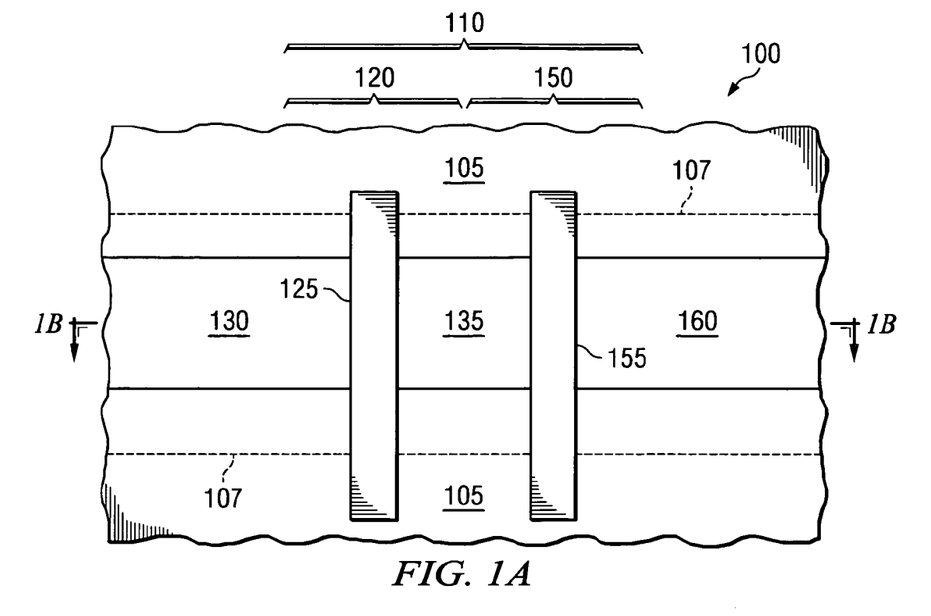
FIGS. 1A and 1B illustrate a plan view and a cross-sectional view, respectively, of a structure on which the method for testing an electrical property of one or more functionally separate transistors located within a transistor array in accordance with the principles of the present invention could be conducted.
Figure 1B:
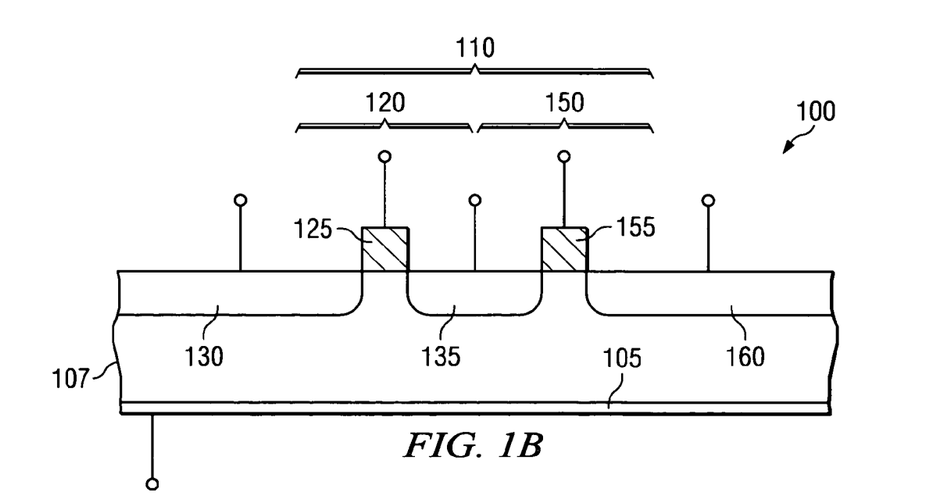

Turning now to FIGS. 1A and 1B, illustrated are a plan view and a cross-sectional view, respectively, of a structure 100 on which the method for testing an electrical property of one or more functionally separate transistors located within a transistor array in accordance with the principles of the present invention could be conducted. The structure 100 illustrated in FIGS. 1A and 1B includes a pair of like functionally separate transistors 110 located on or in a substrate 105, as well as in an active region 107, the pair of like functionally separate transistors 110 including a first transistor 120 and a second transistor 150. As is illustrated in the embodiment of FIGS. 1A and 1B, the first transistor 120 includes a first gate 125, a first outlying terminal 130 and a shared terminal 135. Likewise, the second transistor 150 includes a second gate 155, the shared terminal 135 and a second outlying terminal 160. While not illustrated, the first and second transistors 120, 150 may further include channel implants, pocket/halo implants, etc.

In the exemplary embodiment shown, the shared terminal 135 is a source/drain region shared by the first and second transistors 120, 150. Similarly, the first outlying terminal 130 and the second outlying terminal 160 are source/drain regions of the first and second transistors 120, 150, respectively. As those skilled in the art appreciate, and as will be further discussed below with respect to FIGS. 2A and 2B, the first outlying terminal 130 and the second outlying terminal 160 would generally be shared with adjacent transistors outlying opposing sides of the pair of functionally separate transistors 110.

The electrical properties of the structure 100 may be tested by biasing the shared terminal 135 between the pair of like functionally separate transistors 110 relative to the first gate 125 and second gate 155 of the pair of like functionally separate transistors 110, as well as relative to the first outlying terminal 130 and second outlying terminal 160. For instance, by applying a nominal voltage to the shared terminal 135, while the first gate 125, second gate 155, first outlying terminal 130, second outlying terminal 160, and substrate 105 are held to ground, a leakage current associated with the pair of functionally separate transistors 110 can be obtained. In one exemplary embodiment, the voltage applied to the shared terminal 135 would range from about 0.5 volts to about 2.4 volts. However, other voltages outside of this range may nonetheless also be used.

In this exemplary embodiment, the shared terminal 135 between the pair 110 is biased with respect to the substrate 105, where the bias may be non-zero, thus diode leakage to the substrate is induced. However, the outlying terminals 130, 160 are at the same bias with respect to the substrate 105, and thus little or no diode leakage to the substrate is induced. Accordingly, the outlying terminals 130, 160 act as an isolation region for the pair 110, and thereby reduce or eliminate the parasitic leakage current from adjacent transistors on opposing sides of the pair 110. It should be noted that while FIGS. 1A and 1B are discussed with respect to like transistors, the same idea would also work with transistors that are not like transistors.

Figure 2A:
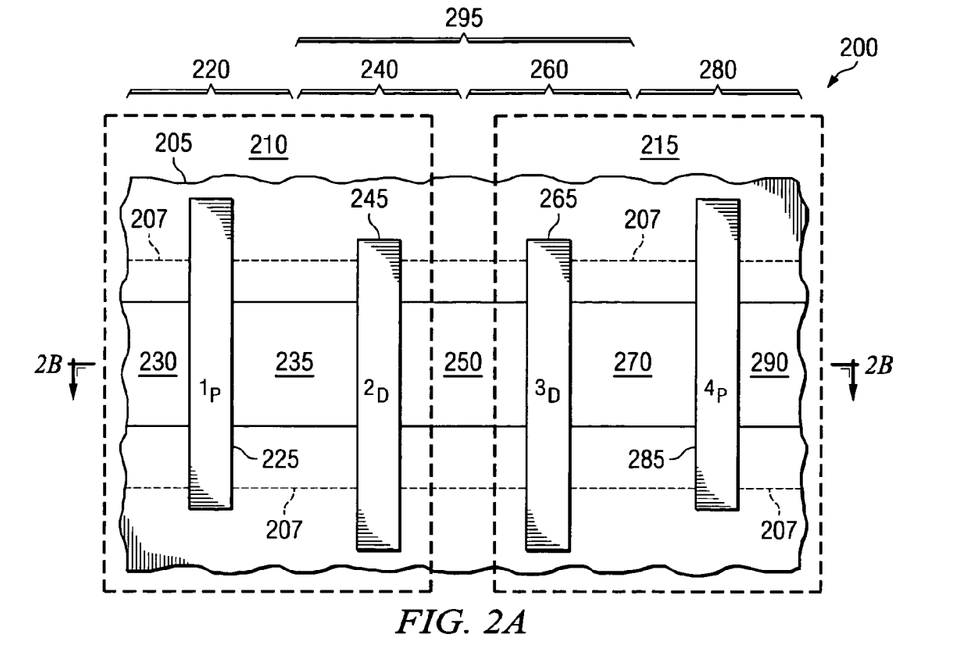
FIGS. 2A and 2B illustrate a plan view and a cross-sectional view, respectively, of an alternative embodiment of a structure on which the method for testing an electrical property of one or more functionally separate transistors located within a transistor array in accordance with the principles of the present invention could be conducted.
Figure 2B:
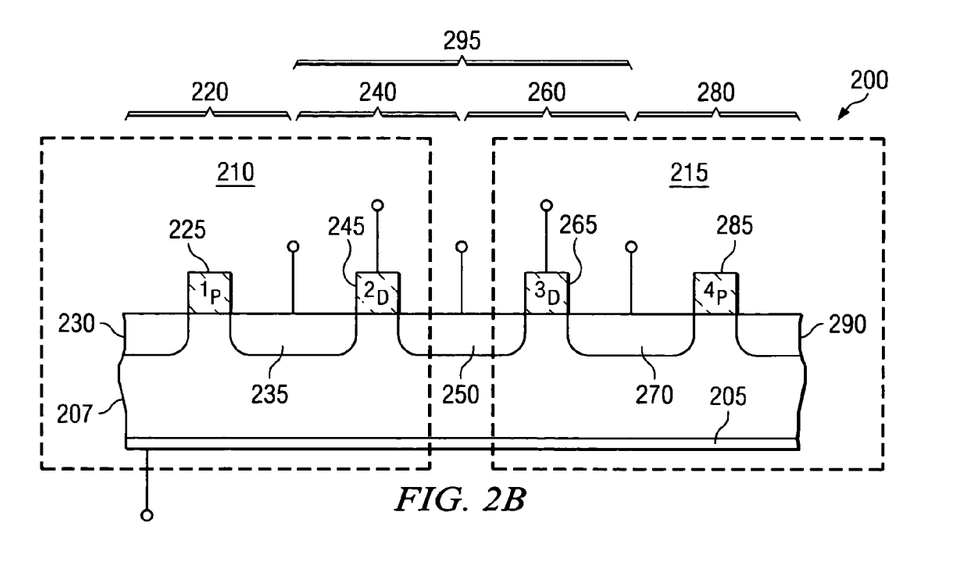
Figure 3A:
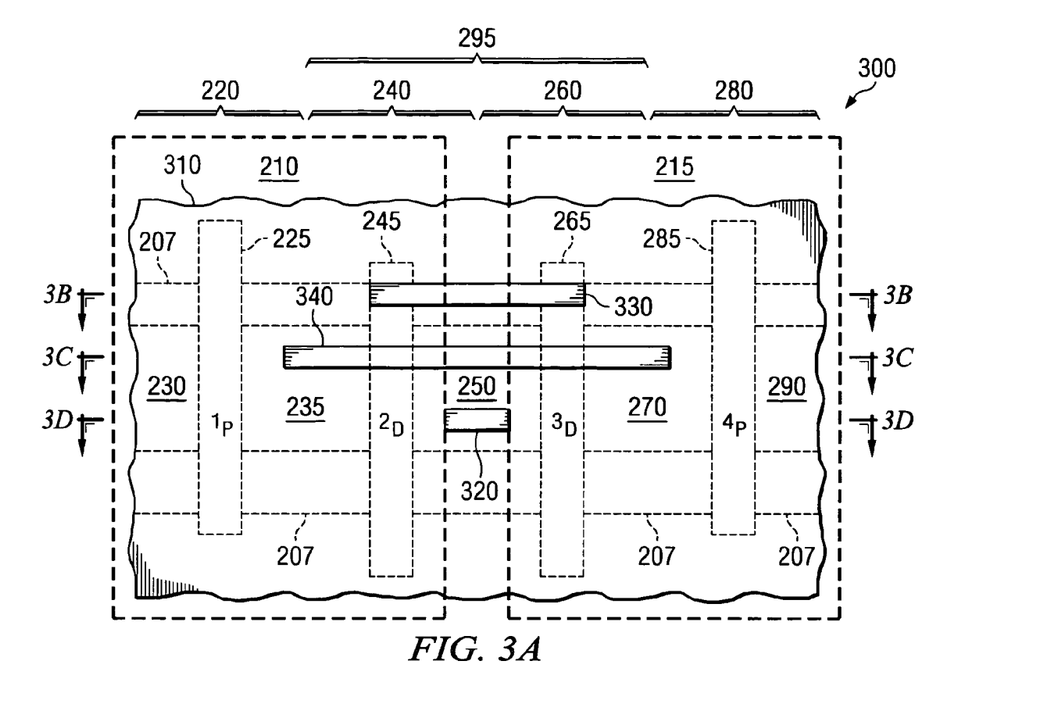
FIGS. 3A thru 3D illustrate a plan view and cross-sectional views of a test structure on which the method for testing an electrical property of one or more functionally separate transistors located within a transistor array in accordance with the principles of the present invention could be conducted.
Figure 3B:
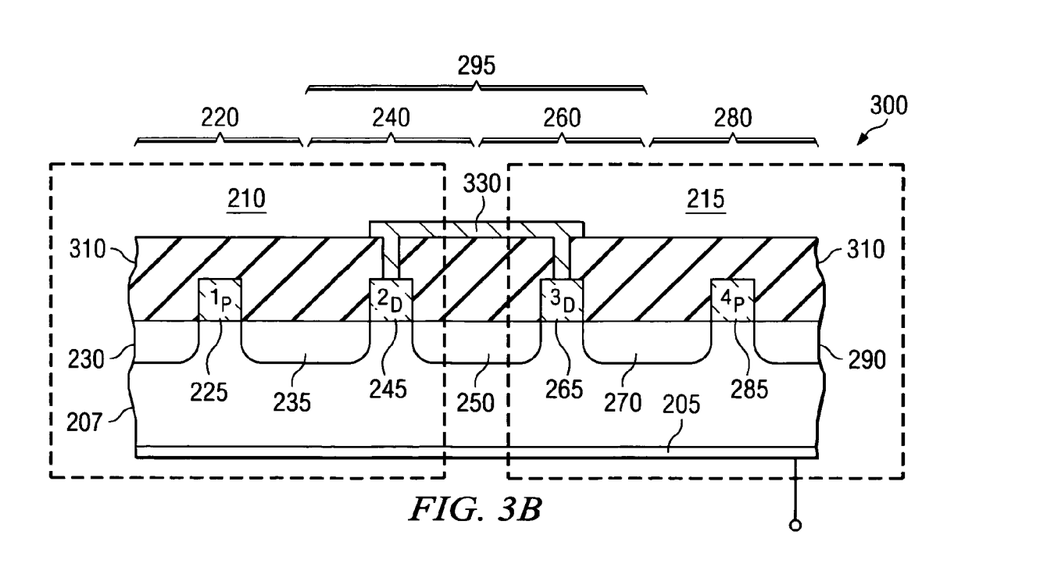
Figure 3C:
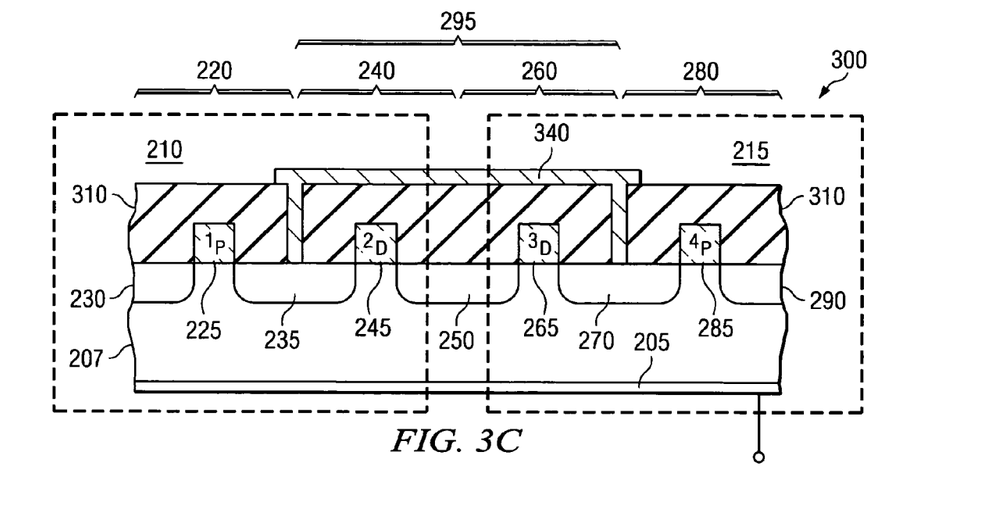
Figure 3D:
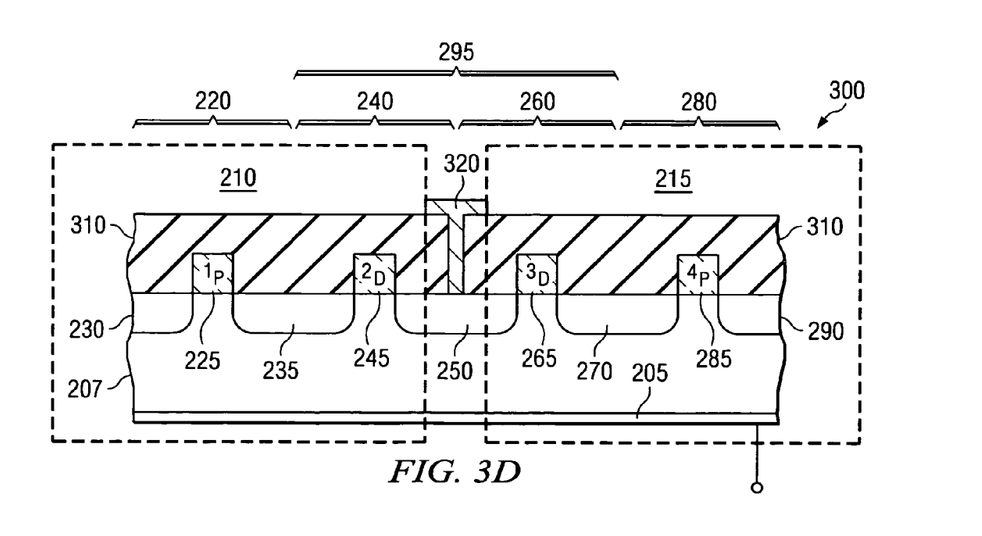
Figure 4A:
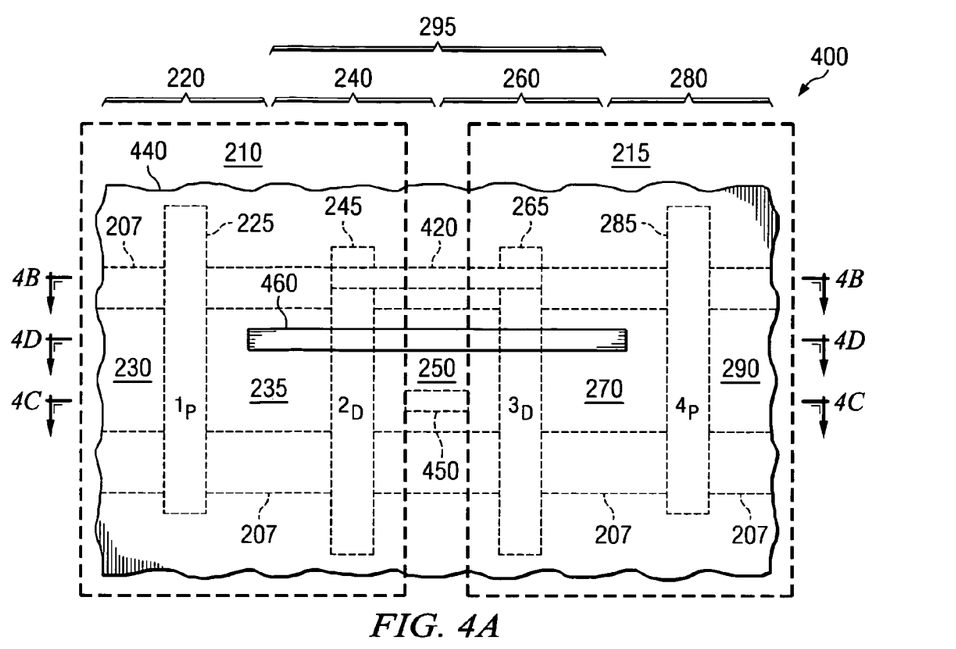
FIGS. 4A thru 4D illustrate a plan view and cross-sectional views of an alternative embodiment of a test structure on which the method for testing an electrical property of one or more functionally separate transistors located within a transistor array in accordance with the principles of the present invention could be conducted.
Figure 4B:
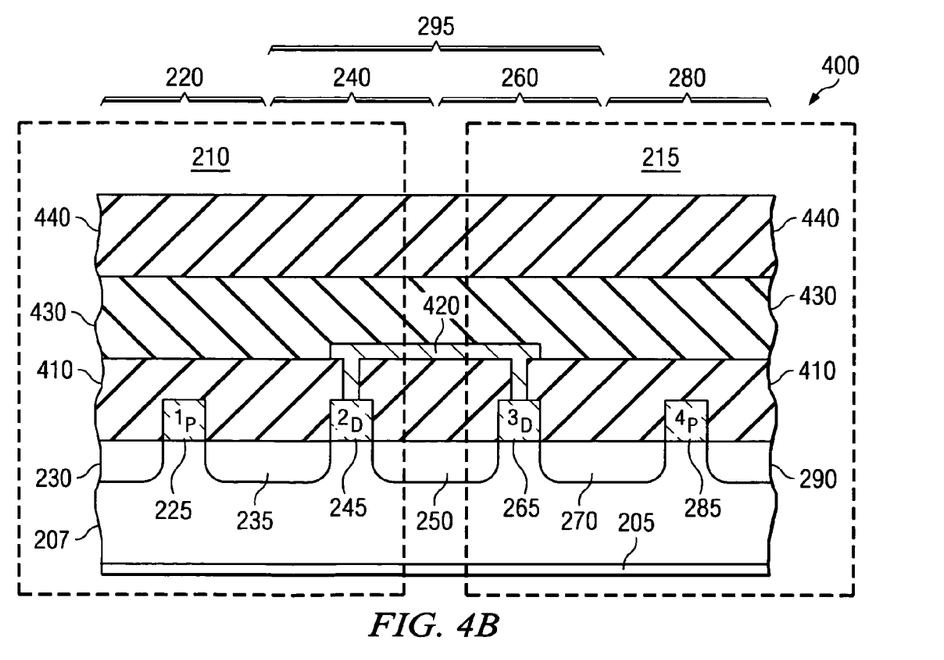
Figure 4C:
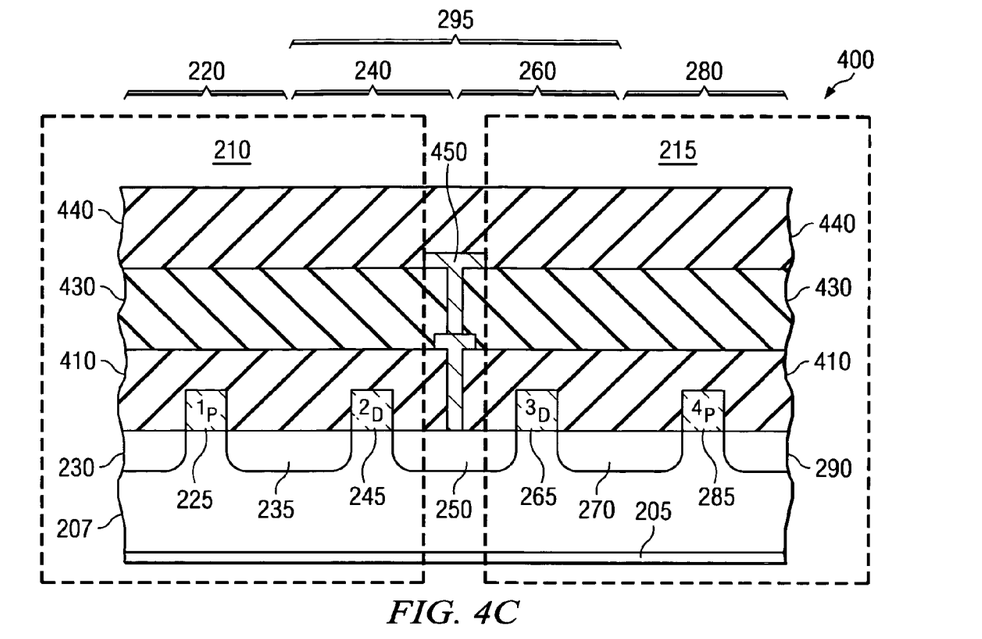
Figure 4D:
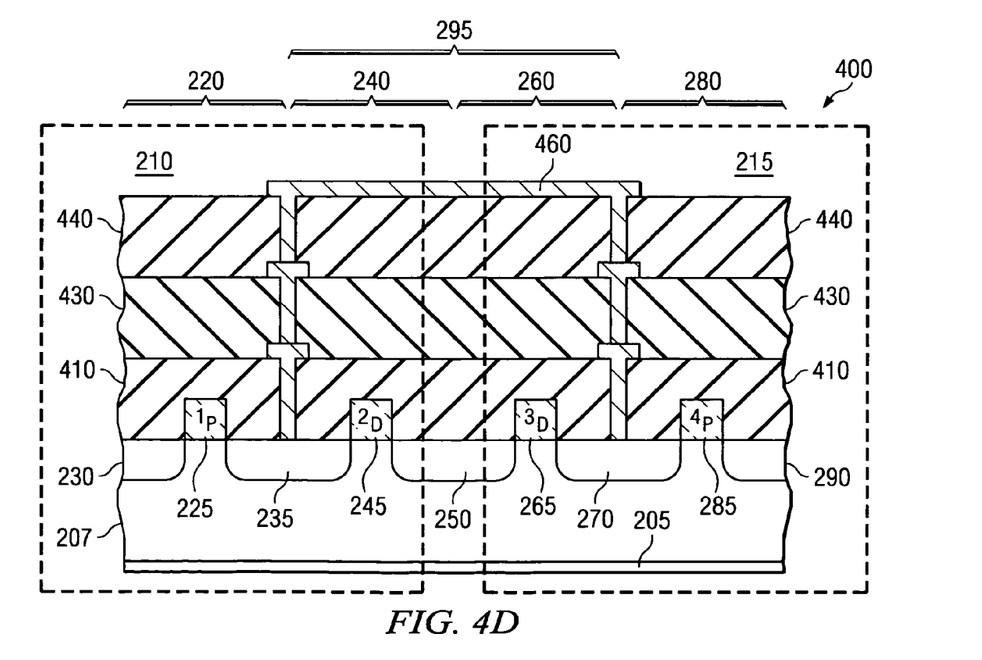

Turning now to FIGS. 2A and 2B, illustrated are a plan view and a cross-sectional view, respectively, of an alternative embodiment of a structure 200 on which the method for testing an electrical property of one or more functionally separate transistors located within a transistor array in accordance with the principles of the present invention could be conducted. The structure 200 illustrated in FIGS. 2A and 2B includes a first functionally separate transistor 220, a second functionally separate transistor 240, a third functionally separate transistor 260 and a fourth functionally separate transistor 280 located on or in a substrate 205, all of which are located within a common active region 207. In the exemplary embodiment shown, the first transistor 220 and the second transistor 240 form at least a portion of a first cell 210 of a SRAM array, and the third transistor 260 and fourth transistor 280 form at least a portion of a second cell 215 of the SRAM array. Moreover, in this embodiment, the first transistor 220 is a first pass transistor and the second transistor 240 is a first drive transistor of the first cell 210, as well as the third transistor 260 is a second drive transistor and the fourth transistor 280 is a second pass transistor of the second cell 215. Additionally, as the first cell 210 and the second cell 215 are located adjacent each other in the structure 200, the features of the first cell 210 and the features of the second cell 215 are symmetrical.

As those skilled in the art appreciate, the first transistor 220 includes a first gate 225, a source/drain region 230, and a shared source/drain region 235. Similarly, the second transistor 240 includes a second gate 245, the shared source/drain region 235 and a shared source/drain region 250. Likewise, the third transistor 260 includes a third gate 265, the shared source/drain region 250, and a shared source/drain region 270. Additionally, the fourth transistor 280 includes a fourth gate 285, the shared source/drain region 270 and a source/drain region 290. Each of the first, second, third and fourth transistors 220, 240, 260, 280 will also traditionally include channel implants, pocket/halo implants, etc., even though such features are not shown in the embodiment of FIGS. 2A and 2B.

In the structure 200 of FIGS. 2A and 2B, the second transistor 240 and the third transistor 260 comprise a pair of like functionally separate transistors 295. Accordingly, the electrical properties, including the leakage current, of the pair of like functionally separate transistors 295 may be measured in accordance with the principles of the present invention. For instance, in one embodiment of the present invention, the shared source/drain region 250 may be biased relative to the second gate 245 and third gate 265, as well as relative to the shared source/drain region 235 and shared source/drain region 270, and further relative to the substrate 205, where the bias may be non-zero. Because the shared source/drain region 235 and the shared source/drain region 270 act as an isolation region for the pair of functionally separate transistors 295, they reduce or eliminate the parasitic leakage current from the first transistor 220 and fourth transistor 280 that are outlying opposing sides of the pair of like functionally separate transistors 295. The shared source/drain region 250 may also be biased to represent the bias condition of the circuit in the mode of interest for the leakage current characterization.

It should be noted that while in this embodiment the pair of like functionally separate transistors 295 are drive transistors, the same theory would hold true if the pair of like functionally separate transistors 295 were pass transistors. For instance, if a third cell were located adjacent and below the second cell 215, the pair of like transistors between the second cell 215 and the third cell would be a pair of like pass transistors. The methodology of the present invention would work equally as well in this alternative embodiment. It should also be noted that other than the shared source/drain region 235 and the shared source/drain region 270, the remaining terminals of the first transistor 220 and the fourth transistor 280 remain open. In other words, no electrical connection is made to the remaining terminals of the first transistor 220 and the fourth transistor 280. Alternatively, terminal 230 and 290 could be held at the substrate potential. It should be noted that while FIGS. 2A and 2B are mainly discussed with respect to like transistors, the same idea would also work with transistors that are not like transistors.

Turning now to FIGS. 3A thru 3D, illustrated are a plan view and cross-sectional views of a test structure 300 on which the method for testing an electrical property of one or more transistors located within a transistor array in accordance with the principles of the present invention could be conducted. The test structure 300, in one exemplary embodiment, is a substantial replication of a plurality of device structures that might ultimately be sold to a consumer. The test structure 300 is substantially similar to the structure 200 illustrated in FIGS. 2A and 2B, with the exception that the test structure 300 includes a first interconnect 320 configured to contact the shared source/drain region 250 between the pair of functionally separate transistors 295, a second interconnect 330 configured to directly couple and contact the second gate 245 and the third gate 265, and a third interconnect 340 configured to directly couple and contact the shared source/drain region 235 and shared source/drain region 270, all of which are located within a dielectric layer 310. It should be noted that FIGS. 3A thru 3D illustrate but one embodiment of a method for forming the first, second and third interconnects 320, 330, 340. For example, another embodiment might exist wherein the interconnects 320, 330, 340 are formed on different levels of the test structure 300.

Using the test structure 300 of FIGS. 3A thru 3D, the first interconnect 320 may be biased relative to the second and third interconnects 330, 340, and moreover may be biased relative to the substrate 205 where the bias may be non-zero, to obtain a leakage current associated with the pair of functionally separate transistors 295. As certain features of the test structure 300 are directly coupled, and thus hard wired, the test structure 300 would generally not be usable for anything but testing. In other words, the test structure 300 would generally not be subsequently used as part of a circuit in a usable product that would be sold to a customer. However, the test structure 300 may be incorporated within the material sold to a customer. Whether or not incorporated within the material sold to a customer, information obtained from the test structure 300 could be used to assist in the development of the transistors for product, and in the manufacture of actual product.

Turning now to FIGS. 4A thru 4D, illustrated are a plan view and cross-sectional views of an alternative embodiment of a test structure 400 on which the method for testing an electrical property of one or more functionally separate transistors located within a transistor array in accordance with the principles of the present invention could be conducted. The test structure 400 is substantially similar to the test structure 300 illustrated in FIGS. 3A thru 3D, with the exception that the interconnects are located on different metal levels in the embodiment illustrated in FIGS. 4A thru 4D, as compared to the same metal level in FIGS. 3A thru 3D. For example, a first interconnect 420 is located in a first dielectric layer 410 at metal level one, and is configured to directly couple and contact the second gate 245 and the third gate 265. Similarly, a second interconnect 450 is located in a second dielectric layer 430 at metal level two, and is configured to contact the shared source/drain region 250 between the pair of functionally separate transistors 295. Additionally, a third interconnect 460 is located in a third dielectric layer 440 and at metal level three, and is configured to directly couple and contact the shared source/drain region 235 and shared source/drain region 270. It should be noted that other embodiments exist wherein the first, second and third interconnects 420, 450, 460 are located at different metal levels than shown in FIGS. 4A thru 4D.

Figure 5A:
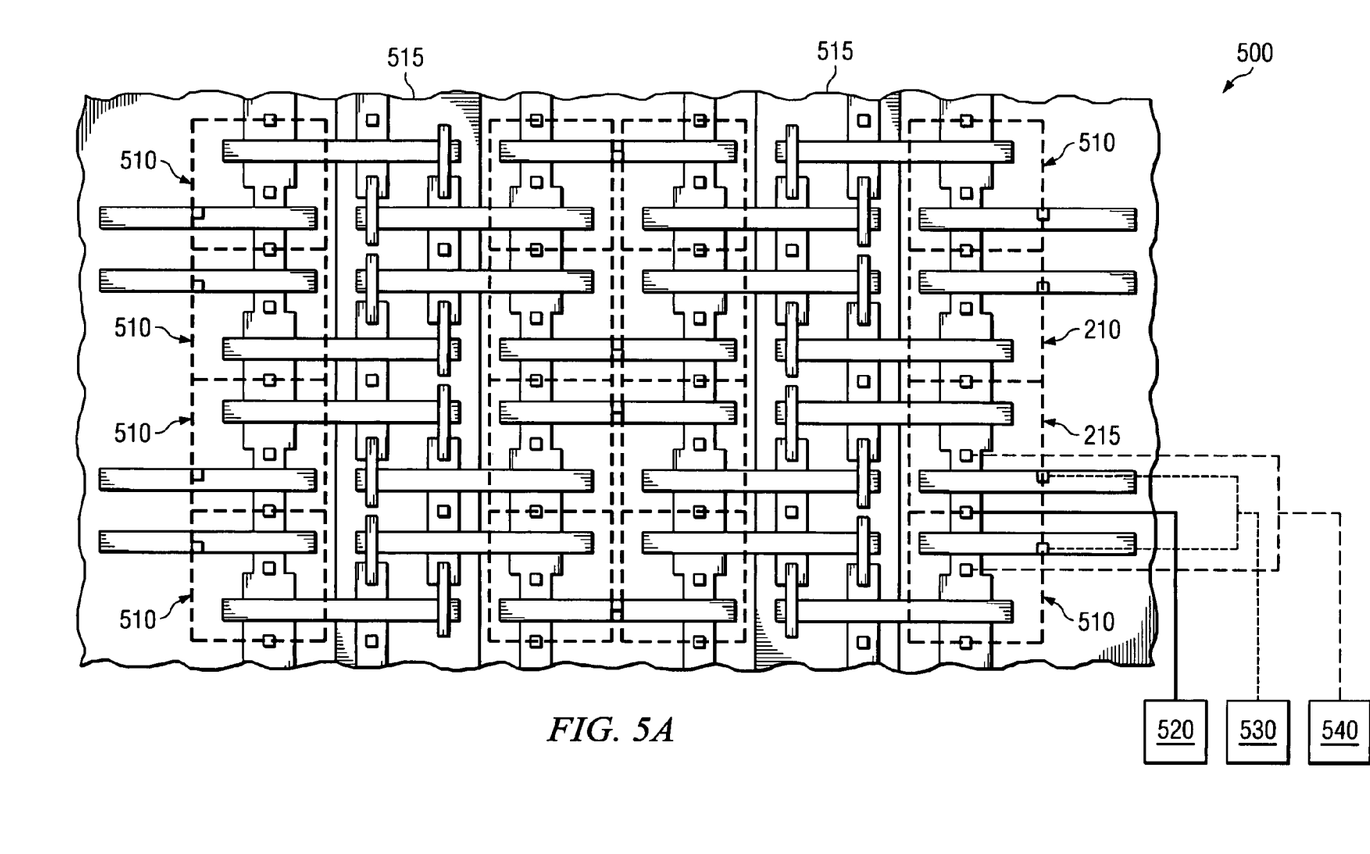
FIGS. 5A and 5B illustrate a plan view of SRAM structures on which the method for testing an electrical property of one or more functionally separate transistors located within a transistor array in accordance with the principles of the present invention could be conducted.
Figure 5B:
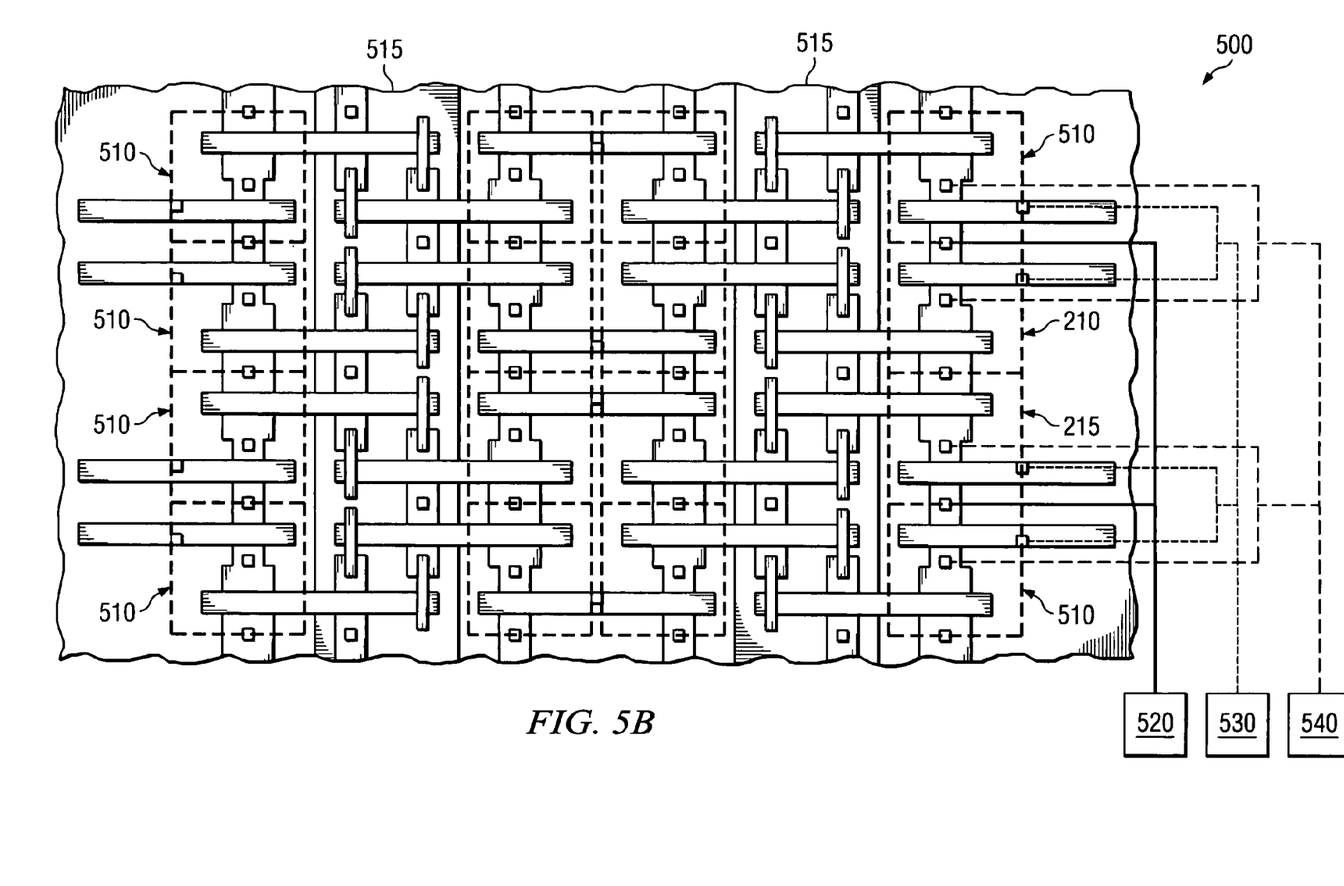

Turning finally to FIGS. 5A and 5B, with continued reference to FIGS. 2A and 2B, illustrated is a plan view of SRAM structures 500 on which the method for testing an electrical property of one or more functionally separate transistors located within a transistor array in accordance with the principles of the present invention could be conducted. FIGS. 5A and 5B illustrate that the SRAM structures 500 may include a plurality of different symmetric cells 510, where cells 510 are the driver and pass gate portion of the SRAM cell, in addition to the first cell 210 and second cell 215. As is illustrated, the cells 210, 215, 510 tend to be symmetric with one another. Accordingly, across any two adjacent cells 210, 215, 510, a pair of like transistors may be found. As those skilled in the art appreciate, the SRAM structures 500 may, and often do, include load gate portions 515.

In an alternative embodiment, leakage may be measured for pairs comprising a drive transistor and a pass transistor, with the outer source/drain regions biased at the substrate potential. In this alternative embodiment, the measurement gives the combined leakage contribution of the driver and pass transistors without allocating the leakage to the individual transistors. In another alternative embodiment, leakage can be measured for four adjacent transistors comprising a first drive transistor, a first pass transistor, a second pass transistor, and a second drive transistor, where the outer source/drain regions of the two drive transistors are biased at the substrate potential. Those skilled in the art will recognize further similar embodiments.

FIGS. 5A and 5B are further used to illustrate that multiple like pairs of like transistors may be characterized in parallel. By characterizing a number of different like pairs of like transistors at the same time, the effect of random variation may be substantially reduced. When characterizing the number of different like pairs of like transistors, the final measured leakage current may be divided by the number of transistors in the number of like pairs of like transistors to obtain an accurate average leakage current for the type of transistor in the number of like pairs of like transistors.

Given the embodiment of the SRAM structure 500 illustrated in FIGS. 5A and 5B, each of the terminals between the like pairs of like transistors may be electrically coupled to a first single bond pad 520 of the SRAM structures 500. Similarly, each of the gates of the like pairs of like transistors may be electrically coupled to a second different bond pad 530 of the SRAM structures 500. Additionally, each of the terminals outlying the like pairs of like transistors may be electrically coupled to a third different bond pad 540 of the SRAM structures 500. Accordingly, the SRAM structures 500 may be tested in accordance with the principles of the present invention using the first, second and third bond pads 520, 530, 540.

Although the present invention has been described in detail, those skilled in the art should understand that they could make various changes, substitutions and alterations herein without departing from the spirit and scope of the invention in its broadest form.

What is claimed is:

1. A method for testing an electrical property of one or more functionally separate transistors located within an active region that is common with other transistors, comprising:
    providing a pair of functionally separate transistors of a similar conductivity type located within an active region; and
    biasing a terminal between the pair relative to gates of the pair and terminals outlying the pair to obtain a leakage current associated with the pair.

2. The method as recited in claim 1 wherein the pair is a pair of like functionally separate transistors.

3. The method as recited in claim 2 wherein the pair is a first like pair and further including providing one or more additional like pairs of the like functionally separate transistors and biasing a terminal between each of the one or more additional like pairs relative to gates of each of the additional like pairs and terminals outlying each of the additional like pairs to obtain a leakage current associated with the first pair and the one or more additional like pairs.

4. The method as recited in claim 2 further including dividing the leakage current by two to obtain a leakage current of each of the pair of like functionally separate transistors.

5. The method as recited in claim 2 wherein providing a pair of like functionally separate transistors includes providing a pair of like drive transistors of a static random access memory (SRAM) device.

6. The method as recited in claim 2 wherein providing a pair of like functionally separate transistors includes providing a pair of like pass transistors of a static random access memory (SRAM) device.

7. The method as recited in claim 1 wherein biasing a terminal between the pair includes biasing a source/drain region shared by the pair.

8. The method as recited in claim 7 wherein the terminals outlying the pair are source/drain regions outlying the pair.

9. The method as recited in claim 8 wherein the source/drain regions outlying the pair are source/drain regions shared with adjacent transistors outlying opposing sides of the pair.

10. The method as recited in claim 1 wherein the active region is adjacent a substrate region and wherein the method further comprises biasing the terminals outlying the pair at substantially the same voltage as the substrate region.

11. The method as recited in claim 10 wherein the pair of functionally separate transistors comprises a first transistor and a second transistor, the first transistor including a first source/drain region and a second source/drain region, the second transistor including a third source/drain region and a fourth source/drain region, wherein the first source/drain region and the fourth source/drain region comprise the outlying terminals and the second and third source/drain regions comprise the terminal, and further including providing a third transistor and a fourth transistor, the third transistor including a fifth source/drain region and a sixth source/drain region and the fourth transistor including a seventh source/drain region and an eighth source/drain region, wherein the fifth source/drain region and the first source/drain region are shared source/drain regions and the seventh source/drain region and the fourth source/drain region are shared source/drain regions.

12. The method as recited in claim 1 further including directly coupling the gates of the pair and directly coupling the terminals outlying the pair before biasing.

13. The method as recited in claim 1 wherein a first interconnect is configured to contact the terminal between the pair, a second interconnect is configured to directly couple and contact the gates of the pair, and a third interconnect is configured to directly couple and contact the terminals outlying the pair, the first, second and third interconnects located on different metal levels, and wherein the first interconnect, second interconnect and third interconnect are coupled to a first bond pad, a second bond pad and a third bond pad, respectively.

14. A method for characterizing the leakage current of at least one of a plurality of functionally separate transistors located in a common active region of a circuit, comprising:
providing a test structure comprising a substantial replication of a plurality of functionally separate transistors located in a common active region of a circuit, the test structure thereby including a plurality of test transistors located in a common active test region; and
biasing at least one pair of test transistors within the plurality of test transistors such that a leakage current of the at least one pair can be measured without contamination of spurious gate-edge-diode-leakage (GEDL) from remaining ones of the plurality of test transistors, the measured leakage current helping to characterize a leakage current of the plurality of transistors located in the common active region of the circuit.

15. The method as recited in claim 14 wherein biasing includes biasing a terminal between the at least one pair relative to gates of the at least one pair and terminals outlying the at least one pair.

16. The method as recited in claim 15 wherein the common active test region is adjacent a substrate test region and wherein the method further comprises biasing the terminals outlying the pair at substantially the same voltage as the substrate test region.

17. The method as recited in claim 16 wherein the at least one pair of functionally separate transistors comprises a first transistor and a second transistor, the first transistor including a first source/drain region and a second source/drain region, the second transistor including a third source/drain region and a fourth source/drain region, wherein the first source/drain region and the fourth source/drain region comprise the outlying terminals and the second and third source/drain regions comprise the terminal, and wherein the plurality of test transistors further includes a third transistor and a fourth transistor, the third transistor including a fifth source/drain region and a sixth source/drain region and the fourth transistor including a seventh source/drain region and an eighth source/drain region, wherein the fifth source/drain region and the first source/drain region are shared source/drain regions and the seventh source/drain region and the fourth source/drain region are shared source/drain regions.

18. The method as recited in claim 14 wherein the at least one pair is at least one pair of like functionally separate transistors.

19. The method of claim 14 where the circuit is an SRAM array.

20. A test structure for testing one or more functionally separate transistors located within a common active region, comprising:
a pair of like functionally separate transistors located within a common active region;
a first interconnect configured to contact a terminal between the pair;
a second interconnect configured to directly couple and contact gates of the pair; and
a third interconnect configured to directly couple and contact terminals outlying the pair, the first, second and third interconnects configured to allow the terminal to be biased relative to the gates and outlying terminals to obtain a leakage current associated with the pair.

21. The test structure as recited in claim 20 further including one or more additional pairs of functionally separate transistors, wherein the pair and the one or more additional pairs are connected in parallel to the first, second and third interconnects.

* * * * *